United States Patent [19]

Nakano et al.

[11] Patent Number: 6,156,474

[45] Date of Patent: Dec. 5, 2000

[54] POSITIVE TYPE PHOTORESIST COMPOSITION

[75] Inventors: Sigeki Nakano, Kajikawa-mura; Akira Awaji, Toyoura-machi; Teruaki Ogawa, Ohyachi Niigata; Kenta Takahashi, Toyosaka, all of Japan

[73] Assignee: Shipley Company, L.L.C., Marlborough, Mass.

[21] Appl. No.: 09/203,986

[22] Filed: Dec. 2, 1998

[30] Foreign Application Priority Data

Dec. 24, 1997 [JP] Japan ..................... 9-354695

[51] Int. Cl.$^7$ ..................... G03F 7/023
[52] U.S. Cl. ................. 430/191; 430/165; 430/192; 430/193
[58] Field of Search ..................... 430/191, 192, 430/193, 165

[56] References Cited

U.S. PATENT DOCUMENTS

| | | | |
|---|---|---|---|
| 5,171,656 | 12/1992 | Sebald et al. | 430/189 |
| 5,674,657 | 10/1997 | Tan et al. | 430/191 |
| 5,750,310 | 5/1998 | Sato et al. | 430/192 |
| 5,834,531 | 11/1998 | Schacht et al. | 522/178 |
| 5,928,818 | 7/1999 | Mertesdorf et al. | 430/18 |

*Primary Examiner*—John S. Chu
*Attorney, Agent, or Firm*—Peter F. Corless; Darryl P. Frickey; Edwards & Angell, LLP

[57] ABSTRACT

To provide a positive type photoresist composition which is capable of forming a resist pattern having an excellent adhesion to a substrate, a positive type photoresist composition comprising a polymer containing a specified amount of a polypropylene oxide group and a polyethylene oxide group is provided.

6 Claims, No Drawings

POSITIVE TYPE PHOTORESIST COMPOSITION

BACKGROUND OF THE INVENTION

The present invention relates to a positive type photoresist composition which is sensitive to radiation such as ultraviolet rays, far ultraviolet rays (including eximer lasers etc.), electron beams, ion beams, X-ray and the like, and more specifically to a novel positive type photoresist composition which is capable of forming resist patterns having excellent adhesion with substrates employed for producing semiconductor devices, LCD (thin-film transistor) and the like.

Conventionally, in the process for producing semiconductor devices such as IC and LSI and liquid crystal display elements such as LCD, fine processing according to a photoetching method has been carried out. In this photoetching method, there is adopted a process in which a photoresist is coated on a substrate, an activated ray such as an ultraviolet ray is irradiated through a mask pattern thereon and the substrate is etched using the resist pattern obtained by developing as a protective film. Further, as the photoresist composition employed in this process, it is known that a combination of an alkali-soluble novolak resin for forming a film and a photosensitive component comprising a quinonediazide group-containing benzophenone type compound is preferable (for example, U.S. Pat. No. 4,377,631, Japanese Unexamined Patent Publication (Kokai) No. Sho 62-35349, Japanese Unexamined Patent Publication (Kokai) No. 1-142548 and Japanese Unexamined Patent Publication (Kokai) No. 1-179147).

Incidentally, in the photoetching method in the preparation of a semiconductor device and LCD, adhesion of the resist pattern and the substrate is important, in order to accurately etch the substrate. If adhesion is bad, the bite amount becomes large at the time of wet etching and short circuit of the pattern occurs, disadvantageously.

SUMMARY OF THE INVENTION

It is an object of the present invention to provide a positive type photoresist composition using an alkali-soluble novolak resin which is capable of forming a resist pattern having excellent adhesion with a substrate in the preparation of semiconductor devices and LCDs.

More specifically the present invention relates to a positive type photoresist compound containing an alkali-soluble novolak resin and a quinonediazide group-containing compound as a basic composition comprising a compound represented by the formula (1):

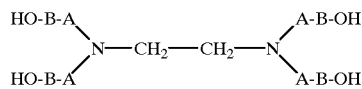

wherein A represents a polypropylene oxide group and B represents a polyethylene oxide group having an average molecular weight of 1,000 to 40,000 and containing 5 to 90% by weight of a polyethylene oxide group based on the molecular weight, and/or a compound represented by the formula (2):

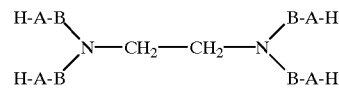

wherein A and B have the same meanings as defined above having an average molecular weight of 2,000 to 30,000 and containing 5 to 90% by weight of a polyethylene oxide group based on the molecular weight, as an adhesion reinforcing agent.

Further, the present invention relates to a positive type photoresist composition in which the compound represented by the formula (1) and/or the formula (2) is added in an amount of 0.1 to 5 parts by weight based on 100 parts by weight of the basic composition.

In the resist composition of the present invention, an alkali-soluble novolak resin is employed as a substance for forming a film. The novolak resin includes, for example, a reaction product of phenols and aldehydes.

The phenol includes an aromatic hydroxy compound such as phenol, o-, m- or p-cresol, 2,5-xylenol, 3,6-xylenol, 3,4-xylenol, 2,3,5-trimethylphenol, 4-t-butylphenol, 2-t-butylphenol, 3-t-butylphenol, 2-ethylphenol, 3-ethylphenol, 4-ethylphenol, 3-methyl-6-t-butylphenol, 4-methyl-2-t-butylphenol, 2-naphthol, 1,3-dihydroxynaphthalene, 1,6-dihydroxynaphthalene and 1,7-dihydroxynaphthalene.

The aldehyde includes formaldehyde, paraformaldehyde, acetaldehyde, propylaldehyde, benzaldehyde, phenylaldehyde and the like.

The reaction of a phenol with an aldehyde is carried out in the presence of a catalyst and is carried out in a bulk or a solvent. As the catalyst, there may be mentioned an organic acid (formic acid, oxalic acid, p-toluenesulfonic acid, trichloroacetic acid and the like), an inorganic acid (phosphoric acid, hydrochloric acid, sulfuric acid, perchloric acid and the like) and a divalent metal salt (zinc acetate, magnesium acetate and the like).

In the resist composition of the present invention, a quinonediazide group-containing compound is employed as a photosensitive component. The quinonediazide group-containing compound includes, for example, an entirely esterified compound or a partially esterified compound of polyhydroxybenzophenone such as 2,3,4-trihydroxybenzophenone and 2,3,4,4'-tetrahydroxybenzophenone with naphthoquinone-1,2-diazide-5-sulfonic acid or naphthoquinone-1,2-diazide-4-sulfonic acid.

Further, there can be employed other quinonediazide group-containing compound, for example, orthobenzoquinonediazide, orthonaphthoquinonediazide, orthoanthraquinonediazide or neuclues-substituted derivatives thereof such as orthonaphthoquinonediazidesulfonic acid ester, and further a reaction product of orthonaphthoquinonesulfonyl chloride with a compound having a hydroxyl group or an amino group, for example, phenol, p-methoxyphenol, dimethylphenol, hydroquinone, bisphenol A, naphthol, carbinol, pyrocatechol, pyrogallol, pyrogallol monomethyl ether, pyrogallol-1,3-dimethyl ether, gallic acid, esterified or etherified gallic acid in which hydroxyl groups are partially remained, aniline, p-aminodiphenylamine and the like. These may be employed singly or may be employed in combination of two kinds or more.

These quinonediazide group-containing compounds can be prepared, for example, by condensing the above-mentioned polyhydroxybenzophenone with naphthoquinone-1,2-diazido-5-sulfonyl chloride or naphthoquinone-1,2-diazido-4-sulfonyl chloride in an appropriate solvent such as dioxane in the presence of an alkali such as triethanolamine, alkali carbonate and alkali hydrogencarbonate to effect entire esterification or partial esterification thereof.

In the resist composition of the present invention, the compound represented by the above-mentioned formula (1) and/or the formula (2) is employed as an adhesion-reinforcing agent.

The compounds represented by the formulae (1) and (2) are block copolymers of a hydrophobic polypropylene oxide group A (a polymer group containing —CH(CH$_3$)CH$_2$O— as a constituting unit) and a hydrophilic polyethylene oxide group B (a polymer group containing —CH$_2$—CH$_2$—O— as a constituting unit), and are known as a nonionic surface active component.

The average molecular weight of the compound represented by the formula (1) is 1000 to 40,000, and the content of the polyethylene oxide group (B) in this compound is 5 to 90% by weight based on the above-mentioned molecular weight. Preferably, the average molecular weight of the compound represented by the formula (1) is 2,500 to 12,000, and the content of the polyethylene oxide group (B) in this compound is 10 to 70% by weight based on the above-mentioned average molecular weight. Most preferably, the average molecular weight of the compound represented by the formula (1) is 2,500 to 7,000, and the content of the polyethylene oxide group (B) in this compound is 10 to 40% by weight based on the above-mentioned average molecular weight.

The compound employable in the present invention includes, for example, TETRONIC (registered trademark) 304, 504, 701, 702, 704, 707, 901, 904, 908, 909, 1101, 1102, 1104, 1107, 1301, 1302, 1304, 1307, 1501, 1502, 1504 and 1508 (manufactured by BASF). The average molecular weight of these compounds and the content (% by weight) of the polyethylene oxide group based on the average molecular weight are shown in Table 1.

TABLE 1

| Compound of the formula (1) | Average molecular weight | Content of Polyethylene oxide group (% by weight) |
| --- | --- | --- |
| 304 | 1650 | 40 |
| 504 | 3400 | 40 |
| 701 | 3600 | 10 |
| 702 | 4000 | 20 |
| 704 | 5500 | 40 |
| 707 | 12200 | 70 |
| 901 | 4700 | 10 |
| 904 | 6700 | 40 |
| 908 | 25000 | 80 |
| 909 | 30000 | 90 |
| 1101 | 5300 | 10 |
| 1102 | 6200 | 20 |
| 1104 | 8300 | 40 |
| 1107 | 15000 | 70 |
| 1301 | 6800 | 10 |
| 1302 | 7700 | 20 |
| 1304 | 10500 | 40 |
| 1307 | 18000 | 70 |
| 1501 | 7900 | 10 |
| 1502 | 8900 | 20 |
| 1504 | 12000 | 40 |
| 1508 | 30000 | 80 |

The average molecular weight of the compound represented the formula (2) is 2,000 to 21,000, and the content of the polyethylene oxide group (B) in this compound is 5 of 90% by weight based on the above-mentioned average molecular weight. Preferably, the average molecular weight of the compound represented by the formula (2) is 2,500 to 12,000, and the content of the polyethylene oxide group (B) in this compound is 10 to 70% by weight based on the above-mentioned average molecular weight. Most preferably, the average molecular weight of the compound represented by the formula (2) is 3,000 to 6,000, and the content of the polyethylene oxide group (B) in this compound is 10 to 40% by weight based on the above-mentioned average molecular weight.

The compound represented by the formula (2) employable in the present invention includes, for example, TETRONIC (registered trademark) 50R1, 50R4, 50R8, 70R1, 70R2, 70R4, 90R1, 90R4, 90R8, 110R1, 110R2, 110R7, 130R1, 130R2, 150R1, 150R4 and 150R8 (manufactured by BASF). The average molecular weight of these compounds and the content (% by weight) of the polyethylene oxide group based on the average molecular weight are shown in Table 2.

TABLE 2

| Compound of the formula (2) | Average molecular weight | Content of Polyethylene oxide group (% by weight) |
| --- | --- | --- |
| 50R1 | 2640 | 10 |
| 50R4 | 3740 | 40 |
| 50R8 | 10200 | 80 |
| 70R1 | 3400 | 10 |
| 70R2 | 3870 | 20 |
| 70R4 | 5230 | 40 |
| 90R1 | 4580 | 10 |
| 90R4 | 7240 | 40 |
| 90R8 | 18700 | 80 |
| 110R1 | 5220 | 10 |
| 110R2 | 5900 | 20 |
| 110R7 | 13200 | 70 |
| 130R1 | 6800 | 10 |
| 130R2 | 7740 | 20 |
| 150R1 | 8000 | 10 |
| 150R4 | 11810 | 40 |
| 150R8 | 20400 | 80 |

The resist composition of the present invention contains the compound represented by the above-mentioned formula (1) and/or the formula (2) preferably in an amount ranging from 0.05 to 20 parts by weight, more preferably, 0.5 to 10 parts by weight based on 100 parts by weight of the novolak resin, as an adhesion-reinforcing agent.

The resist composition of the present invention may further include, if necessary, compatible additives, for example, a conventionally employable component such as a resin, a plasticizer, a stabilizer and a surface active agent for improving the performance of the resist film, a dye for improving a visually recognizing property of a resist pattern after development and a sensitizer for improving a sensitization effect.

In the resist composition of the present invention, the alkali-soluble novolak resin, the quinonediazide group-containing compound, the compound represented by the above-mentioned formula (1) and/or the formula (2) and, if desired, the various kinds of additives are used in the form of a solution which are dissolved in an appropriate solvent.

The solvent includes ketones such as 2-heptanone, acetone, methyl ethyl ketone and 1,1,1-trimethylacetone; polyvalent alcohols and derivatives thereof such as ethylene glycol monoacetate, propylene glycol monoacetate, monomethyl ether, monoethyl ether, monopropyl ether, monobutyl ether or monophenyl ether of diethylene glycol or diethylene glycol monoacetate; cyclic ethers such as dioxane; and esters such as ethyl lactate, methyl acetate, ethyl acetate, butyl acetate, methyl propionate, ethyl pyruvate, methyl 3-methoxypropionate and methyl 3-ethoxypropionate. These solvents may be employed not only singly but also in combination of two kinds or more. The amount of the solvent to be employed is not particularly limited so long as the uniform coating can be performed on the substrate such that the resulting coating film may have neither pin hall nor coating irregularity. The resist composition is usually prepared so that the amount of the solvent becomes 50 to 97% by weight based on the whole resist.

One example of the preferable method of using the resist composition of the present invention is given below.

First, a positive type photoresist solution containing the above-mentioned respective components is coated on a substrate by means of a spinner, followed by drying to form a photoresist layer. The photoresist layer is exposed to ultraviolet rays using a low pressure mercury lamp, a high pressure mercury lamp, an ultra high pressure mercury lamp, an arc lamp, a xenon lamp and the like through a predetermined mask pattern.

Next, the photoresist layer is dipped in a developer, for example, an aqueous weakly alkaline solution such as 1 to 10% by weight of an aqueous tetramethylammonium hydroxide solution. Then, the exposed portion is selectively dissolved and removed, and the resist pattern which is faithful to the mask pattern can be formed on the substrate. Subsequently, the substrate on which the thus obtained resist pattern is exposed is etched as a mask using a known method, followed by peeling off of the resist pattern to form a circuit pattern on the substrate.

It should be noted that, the "average molecular weight" mentioned herein means the value which is calculated based on the hydroxyl value measured according to the following procedures (a phthalation method).

Reagent Employed (1) A solution of phthalic anhydride in pyridine: 42 g of phthalic anhydride is completely dissolved in 300 ml of pyridine and the solution is aged at 70° C. for 2 hours or at room temperature overnight. Further, this reagent is preserved in a colored bottle and is renovated within 8 days. The colored reagent is not employed.

(2) Pyridine (3) 0.5N Aqueous sodium hydroxide solution (4) A solution of phenolphthalein in pyridine (1 w/v %)

Procedures (1) A prescribed amount of a sample is precisely metered in a 300 ml flask [S (g)]. Further, in the case where the metered amount is less than 1 g, the amount is metered in the order of $10^{-1}$ mg and in the case where the metered amount is not less than 1 g, the amount is metered in the order of mg.

(2) 25 ml of a solution of phthalic anhydride in pyridine is precisely added to the sample by means of a transfer pipette and after a peg is sealed with pyridine, the mixture is heated on a boiled water bath for 2 hours (the flask is shaked every 15 minutes).

(3) After heating, the flask is taken out from the water bath and cooled to normal temperature.

(4) The peg is washed with pyridine (the washed solution is dropped in the flask) and 0.5N aqueous sodium hydroxide solution is precisely added to the mixture by means of a 50 ml transfer pipette.

(5) Ten drops of an indicator (a solution of phenolphthalein in pyridine) are added to the mixture.

(6) The mixture is titrated with 0.5N aqueous sodium hydroxide solution [A (ml)]. The point that a red color is kept for at least 15 seconds is determined as an end point.

(7) In this test, a blank determination is carried out under the same condition [B (ml)].

Calculation of the Average Molecular Weight (1) Calculation of a Hydroxyl Value $$OHV=[28.05\times(B-A)\times f]/S$$

wherein OHV represents a hydroxyl value (mgKOH/g), B represents an amount (ml) of 0.5N aqueous sodium hydroxide solution required for titration in the blank test, A represents an amount (ml) of 0.5N aqueous sodium hydroxide solution required for titration of the sample, f represents a factor of 0.5N aqueous sodium hydroxide solution and S represents an amount (g) of the sample. It should be noted that, in the case where the sample contains a free acid, the above formula is corrected by the following formula.

Corrected value=hydroxyl value+acid value (2) Calculation of an Average Molecular Weight Average molecular weight=$(56.1\times2\times1,000)$/OHV wherein 56.1 represents a formular weight of KOH and 2 represents the number of a functional group (OH group).

DESCRIPTION OF THE PREFERRED EMBODIMENT

In the following, the present invention will be described in more detail by way of Examples. It should be noted that the present invention is not limited at all to these Examples.

EXAMPLE

A mixture obtained by mixing m-cresol and p-cresol at a weight ratio of 4:6 was employed, and 100 g of cresol novolak resin (average molecular weight: 5,000) prepared by a conventional process, 20 g of naphthoquinone-1,2-diazido-5-sulfonic acid ester of 2,3,4,4'-tetrahydroxybenzophenone and 1.5 g of TETRONIC-701 (manufactured by BASF) as a compound of the formula (1) were dissolved in 500 g of ethylene glycol monoethyl ether acetate to prepare a positive type photoresist solution. The photoresist solution was coated on a glass substrate on which an ITO vapor-deposited film was provided by means of a spinner such that a film thickness becomes 1.5 µm, and the glass substrate was baked at 110° C. for 120 seconds on a hot plate and exposed through a test pattern mask using a contact exposure device PLA-500F (manufactured by Canon Co., Ltd.).

Then, the exposed portion was removed by dipping the glass substrate in 2.88% by weight of an aqueous tetramethylammonium hydroxide solution for 60 seconds to form a resist pattern on the ITO deposited film. The ITO deposited film was etched by dipping the exposed ITO deposited film in an etching solution having a ratio of $FeCl_3$ (99%):HCl (37%)=1:3 for 65 minutes. Then, in order to evaluate adhesion of the resist pattern and the ITO deposited film, the bite amount of the ITO deposited film due to etching at 10 µm pattern was observed by means of an optical microscope. As a result, the bite amount was 1.8 µm and good adhesion was recognized.

COMPARATIVE EXAMPLE

The ITO deposited film was etched in the same manner as in Example 1 except that the TETRONIC-701 was not formulated, and, adhesion of the resist pattern and the ITO deposited film was evaluated. As a result, the bite amount was 2.8 µm.

What is claimed is:

1. A positive photoresist compound comprising an alkali-soluble novolak resin, a quinonediazide group-containing compound, and a compound represented by the following formula (1) or formula (2):

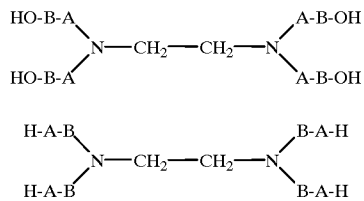

wherein in formula (1) each A independently represents a polypropylene oxide group and each B independently represents a polyethylene oxide group having a molecular weight of 1,000 to 40,000 and containing 5 to 90% by weight of a polypropylene oxide group based on molecular weight; and wherein in formula (2) each A independently represents a polypropylene oxide group and each B independently represents a polyethylene oxide group having a molecular weight of 2,000 to 30,000 and containing 5 to 90% by weight of a polypropylene oxide group based on molecular weight.

2. The photoresist composition of claim 1 wherein the compound represented by the formula (1) or formula (2) is present in an amount of from about 0.1 to 5 parts by weight based on 100 parts by weight of the novolak resin and a quinonediazide group-containing compound.

3. A substrate comprising a coating layer of a photoresist composition of claim 1.

4. The substrate of claim 3 wherein the substrate is glass.

5. The substrate of claim 3 wherein the substrate is a glass substrate with an ITO film thereon, the photoresist composition coating layer applied over the ITO film.

6. The glass substrate of claim 3 wherein the compound represented by the formula (1) or formula (2) is present in an amount of from about 0.1 to 5 parts by weight based on 100 parts by weight of the novolak resin and a quinonediazide group-containing compound.

* * * * *